(12) United States Patent
Park

(10) Patent No.: US 7,666,691 B2
(45) Date of Patent: Feb. 23, 2010

(54) ORGANIC SEMICONDUCTOR DEVICES AND ORGANIC ELECTROLUMINESCENT DEVICES PRODUCED BY USING WET PROCESS

(76) Inventor: Byoung-Choo Park, 101-602, Daejin-1cha Apt., Jukjeon-ri, Suji-eup, Yongin-city, 449-752 Kyonggi-do (KR)

(*) Notice: Subject to any disclaimer, the term of this patent is extended or adjusted under 35 U.S.C. 154(b) by 218 days.

(21) Appl. No.: 11/370,462

(22) Filed: Mar. 8, 2006

(65) Prior Publication Data
US 2006/0147615 A1 Jul. 6, 2006

Related U.S. Application Data

(60) Division of application No. 10/918,872, filed on Aug. 16, 2004, now abandoned, which is a continuation of application No. PCT/KR03/00305, filed on Feb. 13, 2003.

(30) Foreign Application Priority Data
Feb. 15, 2002 (KR) .................. 10-2002-0008269

(51) Int. Cl.
H01L 21/20 (2006.01)
(52) U.S. Cl. .......................... 438/22; 438/99
(58) Field of Classification Search ............ 438/22, 438/99
See application file for complete search history.

(56) References Cited

U.S. PATENT DOCUMENTS

| 4,692,994 A | 9/1987 | Moniwa et al. ............ 438/152 |
| 5,091,004 A * | 2/1992 | Tabayashi et al. ......... 106/31.57 |
| 5,895,933 A | 4/1999 | Zhang et al. ............... 257/49 |
| 5,936,259 A | 8/1999 | Katz et al. ................. 257/40 |
| 6,013,982 A | 1/2000 | Thompson et al. ......... 313/506 |

(Continued)

FOREIGN PATENT DOCUMENTS

JP 07-106064 4/1995

(Continued)

OTHER PUBLICATIONS

C. Tang et al, Organic Electroluminescent Diodes, Appl. Phys. Lett. 1987, 51, 913-915.

(Continued)

*Primary Examiner*—Savitri Mulpuri
(74) *Attorney, Agent, or Firm*—Park & Associates IP Law LLC

(57) ABSTRACT

The present invention provides a method for manufacturing an organic semiconductor thin film by a wet process with a composite solution prepared by dissolving at least two organic semiconductor compounds in a mixed organic solvent including at least two organic solvents having different volatility and having different solubilities of the organic compounds at room temperature. Due to the differences in the evaporation speeds of the solvents and the solubilities of the organic compounds, the organic compounds are continuously deposited according to the composition of solvent that sequentially evaporates. Thus, the organic semiconductor thin film having a continuous multi-layer (non-boundary multi-layer) structure can be manufactured where different organic compounds coexist between the organic layers. Especially, the composite solution including at least two organic EL materials are used, and the organic materials are controlled to deposit on the anode in the order of hole injecting—hole transporting—light emitting—electron transporting—electron injecting layers to form an organic EL device.

14 Claims, 4 Drawing Sheets

U.S. PATENT DOCUMENTS

| | | | |
|---|---|---|---|
| 6,150,668 A | 11/2000 | Bao et al. | 257/40 |
| 6,303,963 B1 | 10/2001 | Ohtani et al. | 257/350 |
| 6,380,687 B1 | 4/2002 | Yamazaki | 315/169.3 |
| 6,433,357 B1 | 8/2002 | Kuijk et al. | 257/40 |
| 6,538,390 B2 | 3/2003 | Fujita et al. | 315/169.3 |
| 6,566,156 B1 * | 5/2003 | Sturm et al. | 438/35 |
| 6,582,504 B1 | 6/2003 | Fujita | 106/311 |
| 6,677,243 B2 | 1/2004 | Okada et al. | 438/706 |
| 6,690,028 B2 | 2/2004 | Wakimoto et al. | 257/40 |
| 6,720,029 B2 * | 4/2004 | Fujita et al. | 427/157 |
| 6,794,220 B2 | 9/2004 | Hirai et al. | 438/99 |
| 6,821,649 B2 * | 11/2004 | Kambe et al. | 428/690 |
| 6,825,611 B2 * | 11/2004 | Kobayashi et al. | 313/504 |
| 6,878,312 B1 * | 4/2005 | Kanbe et al. | 252/583 |
| 6,960,364 B2 * | 11/2005 | Suzuri et al. | 427/66 |
| 7,196,360 B2 * | 3/2007 | Seo et al. | 257/101 |
| 2002/0001026 A1 | 1/2002 | Ishikawa et al. | 347/101 |
| 2002/0093283 A1 * | 7/2002 | Seo et al. | 313/504 |
| 2002/0121860 A1 * | 9/2002 | Seo et al. | 313/506 |
| 2004/0109051 A1 * | 6/2004 | Bright et al. | 347/95 |
| 2006/0082627 A9 * | 4/2006 | Bright et al. | 347/95 |
| 2006/0134317 A1 * | 6/2006 | Yang et al. | 427/78 |
| 2007/0187675 A1 * | 8/2007 | Lee et al. | 257/40 |

FOREIGN PATENT DOCUMENTS

| | | |
|---|---|---|
| JP | 2001-052861 | 2/2001 |
| JP | 2001-343518 | 12/2001 |
| KR | 10-2000-0062303 | 10/2000 |
| KR | 10-2001-0078227 | 8/2001 |
| KR | 10-2001-0110183 | 12/2001 |

OTHER PUBLICATIONS

J.H. Burroughes et al., Light-emitting Diodes Based On Conjugated Polymers, Nature 1990. vol. 347. '539-541.

* cited by examiner

ORGANIC SEMICONDUCTOR DEVICES AND ORGANIC ELECTROLUMINESCENT DEVICES PRODUCED BY USING WET PROCESS

CROSS-REFERENCE TO RELATED APPLICATIONS

This application is a divisional application of U.S. patent application Ser. No. 10/918,872 filed on Aug. 16, 2004, now abandoned which is a continuation of International Patent Application No. PCT/KR2003/000305 filed Feb. 13, 2003, which claims priority of pending Korean Application No. 2002-8269, filed Feb. 15, 2002.

FIELD OF THE INVENTION

The present invention relates to a method for manufacturing an organic semiconductor thin film, and an organic semiconductor device and an organic electroluminescent (EL) device manufactured by the same, and more particularly to, a method for manufacturing an organic semiconductor thin film by a wet process, and an organic semiconductor device, such as an organic EL device, manufactured by the same.

BACKGROUND OF THE INVENTION

Generally, organic semiconductor devices including organic diode devices and organic transistor devices are based on the electrical semi-conductivity that relates to the HOMO (Highest Occupied Molecular Orbital) energy level and the LUMO (Lowest Unoccupied Molecular Orbital) energy level of organic materials. Examples of the organic diode devices include organic light emitting diodes and organic electroluminescent (EL) diodes, and examples of the organic transistor devices include organic FET (Field Effect Transistors), organic TFT (Thin Film Transistors), organic SIT (Static Induction Transistors), organic top gate SIT, organic triodes, organic grid transistors, organic thyristors, and organic bipolar transistors. In these organic semiconductor devices, the electrical and optical properties of the devices are strongly depending on the thin film structure of the organic layers formed on a substrate. Thus, the development of the thin film having an efficient structure is technically as important as the development of new organic materials. The present invention relates to a method for manufacturing an organic semiconductor thin film having a new structure with high efficiency, and a device including the organic semiconductor thin film. The present invention can be widely applied to the above-mentioned various organic semiconductor devices.

Hereinafter, the present invention will be described with reference to the organic EL device, which has the simplest structure among the above-mentioned devices. In the organic EL device, a thin film including fluorescent organic compounds is positioned between electrodes, cathode and anode. When a driving voltage is applied to the organic EL device, electrons and holes are injected into the LUMO and HOMO levels of the fluorescent organic compound of the thin film from the cathode and anode, respectively, and the injected electrons and holes are recombined to produce excitons, which emit light (fluorescence or phosphorescence) through losing their activity. In the present invention, a light-emitting device represents an image display device using the organic EL device. The light-emitting devices also include the following modules: a module formed by mounting a connector such as an anisotropic conductive film, FPC (Flexible Printed Circuit), TAB (tape automated bonding) tape or TCP (Tape Carrier Package) to the EL device, a module where a printed circuit board is installed at the end of the TAB tape or TCP, and a module formed by mounting an IC directly on the EL device by a method of COG (chip on glass). Recently, a method for producing an organic or inorganic semiconductor device on a substrate has been considerably developed, and an active matrix display device (light-emitting device) including the organic or inorganic semiconductor device has been also being developed. In the present invention, the semiconductor device also represents a single device or a plurality of devices, which have a switching function.

The organic EL device (also referred as 'EL display device') is a self light-emitting device, and can be produced as a simple passive matrix light-emitting device or an active matrix light-emitting device using TFT. In the organic EL device, organic EL layers are positioned between electrodes, as shown in FIG. 1a. As shown in the figure, the organic EL layers generally have a multi-layered structure, in which the boundary or interface of each layer is clearly distinguished. The representative example of the multi-layer structure, suggested by Tang, et al., includes a hole transporting layer 13, a light-emitting layer 14 and an electron transporting layer 15 (Tang. C. et al. Appl. Phys. Lett. 1987, 51, 913-915). This structure shows high light-emitting efficiency and thus the structure is adopted in almost all kinds of EL devices. Another examples of the multi-layer structure include a structure having a hole injecting layer 12, a hole transporting layer 13, a light-emitting layer 14 and an electron transporting layer 15 which are sequentially formed on an anode 11 of a substrate 10, and a structure having a hole injecting layer 12, a hole transporting layer 13, a light-emitting layer 14, an electron transporting layer 15 and an electron injecting layer 16 which are sequentially formed on an anode 11 of a substrate 10 (See FIG. 1a). The light-emitting layer 14 can be doped with fluorescent dopants. Besides the monomeric low molecular weight EL material, conjugated polymers such as poly(phenylvinylene) were introduced as the EL material in 1990 by Burroughes et al. (Burroughes, J. H. Nature 1990. 347. 539-541). Recently, stability, efficiency and durability of the polymer EL material have been remarkably improved. In this specification, all layers sandwiched between the electrodes are called as the EL layers. Accordingly, the EL layer 20 includes the hole injecting layer 12, the hole transporting layer 13, the light-emitting layer 14, the electron transporting layer 15 and the electron injecting layer 16. When a voltage is applied to the EL layer 20 from the electrodes 11, 17, the electron-hole are recombined at the light-emitting layer 14 to induce the light-emission. In this specification, the EL device also represents the light-emitting device including the electrodes 11, 17 and the EL layer 20. In order to prevent the EL device from being deteriorated due to the exterior air, the substrate (EL panel) on which the EL device has been formed is encapsulated with a sealing material (packaging), and is bonded to a cover member. Then, the connectors (FPC, TAB, etc.) are mounted for connecting the encapsulated EL device to an external driving circuit, which produces a passive or active matrix light-emitting device.

The EL layer 20 can be formed by various methods. Exemplary methods include dry processes such as vacuum evaporation and sputtering, and wet processes such as spin coating, a cast method, an inkjet method, a dipping method, and a printing method. Besides, roll coating, an LB method and ion plating method can also be used. In case of using a low molecular weight compound having a good thermal stability and capable of being sublimated to form a thin film, the dry process such as vacuum evaporation is generally used to manufacture the multi-layer EL device shown in FIG. 1a.

However, the dry process requires a high vacuum environment, the manufacturing conditions should be controlled carefully, and thus the process for fabricating EL devices is complex, resulting in the large manufacturing costs. On the contrary, the wet process, which uses a solution of the organic compounds dissolved in a solvent, and forms an organic layer of the dissolved compounds, has an advantage in that the EL layer can be easily formed. Moreover, the wet process can be used not only for the low molecular weight compound but also for the organic polymer materials. On the other hand, there are disadvantages in the wet process, because of the solvent problem for forming multi-layer structure. Namely, different solvent must be used to form each different layer in forming the multi-EL layer. In this case, to form an upper organic layer on the lower organic layer, a solution, which does not dissolve the lower organic layer formed previously on the substrate, must be used to form the multi-EL layer. However, it is generally difficult to select appropriate set of the solvents to form the multi-EL layers. If an improper solvent is used, the organic layer previously formed on the substrate 10 may be re-dissolved by the solvent to form a new upper layer, and some of the organic materials of the lower or upper organic layers may irregularly diffuses into the neighboring layers. Thus, it is difficult to manufacture the multi-EL layers 20 of FIG. 1a by simply repeating the conventional wet process. Therefore, as shown in FIG. 1b, the wet process is generally carried out to form a single-EL layer 20 in which one or more compounds are uniformly dispersed in the single-EL layer 20. As a result, the EL device manufactured by the conventional wet process shows the low light-emitting efficiency and requires high driving voltage. In some cases, the multi-EL layer 20 can be formed by combination of the wet process and the dry process. However, the multi-EL layer 20 produced with this method also has the low light-emitting efficiency and requires high driving voltage.

SUMMARY OF THE INVENTION A1

An object of the present invention is to provide a method for solving the foregoing problems of an organic semiconductor thin film, such as an organic EL thin film manufactured by the conventional wet process.

In order to achieve these objects, it is provided a method for manufacturing an organic semiconductor thin film by a wet process, which uses a composite solution prepared by dissolving at least two organic semiconductor materials in a mixed solvent including at least two organic solvents having different volatility and having different solubilities of the organic semiconductor materials at room temperature, and an organic semiconductor device manufactured by the same. If the organic semiconductor device is an organic EL device, the organic semiconductor materials include organic compounds having electrical and optical properties for injecting or transporting hole, light-emitting, and transporting and injecting electron et. al.

When the composite solution is used to form a device on a substrate by a printing method, an inkjet method, spin coating or a dipping method, the solvents of the composite solution are sequentially evaporated due to the differences of volatility, and the organic materials having the lower solubility to the residual solvents are sequentially deposited onto the substrate due to the differences of solubility. Therefore, the organic layers are sequentially deposited in the form of a continuous multi-layer structure having indistinct boundaries. Here, each organic layer may include a small amount of a different kind of organic materials of the neighboring organic layers, and the continuous boundary region between the neighboring organic layers includes at least two kinds of materials of the neighboring organic layers in mixed form. Namely, the organic semiconductor layers of the present invention is formed so that the concentrations of at least two organic semiconductor materials (compounds) change with a gradient along with their deposition direction at the interface. The thin film of the present invention forms a continuous multi-layer structure, which is different from the simple conventional multi-layer thin film (FIG. 1a) or uniformly distributed single-layer thin film (FIG. 1b).

It is also provided a method for manufacturing an EL layer having a continuous multi-layer structure by using a composite solution designed to sequentially deposit a hole injecting material, hole transporting material, light-emitting material, electron transporting material, and electron injecting materials on an anode. It is known that a single or simply mixed organic solvent can be used in the wet process for manufacturing the EL thin film. For example, Korean Patent Publication Nos. 2001-0110183, 2001-0078227 and 2000-0062303 disclose that the EL layer can be formed by dissolving EL material in a single or mixed solvent. However, any of them does not suggest the method for forming the continuous and non-boundary multi-layer structure which is provided by the present invention.

DETAILED DESCRIPTION OF THE INVENTION

Figure 1A:
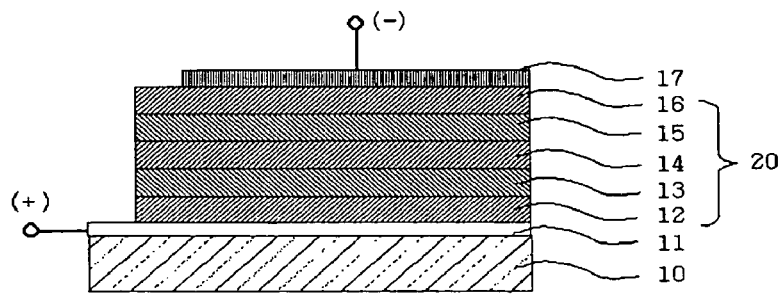
FIG. 1a is a structure diagram for illustrating the conventional organic EL device having a multi-layer structure.
Figure 1B:
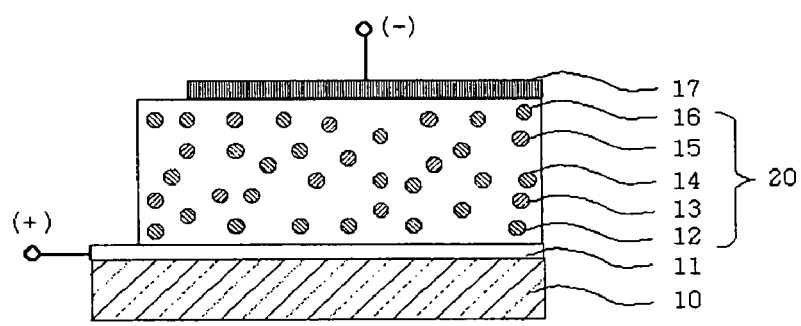
FIG. 1b is a structure diagram for illustrating the conventional organic EL device having a uniformly dispersed single-layer structure.

An organic semiconductor device and an organic EL device manufactured by a wet process in accordance with the present invention will now be described in detail with reference to the accompanying drawings. In the following description, same reference numerals are used for the same elements even in different drawings.

In the EL device of the present invention, the continuous non-boundary multi-layer structure of an organic semiconductor thin film includes at least two layers. For example, it may have one of the following structures. Here, "~" means the continuous non-boundary interface, while "/" means the distinct interface.

(1) anode/hole injecting, transporting layers~light-emitting layer/cathode (2) anode/light-emitting layer~electron transporting, injecting layers/cathode (3) anode/hole injecting, transporting layers—light-emitting layer~electron transporting, injecting layers/cathode.

Figure 2A:
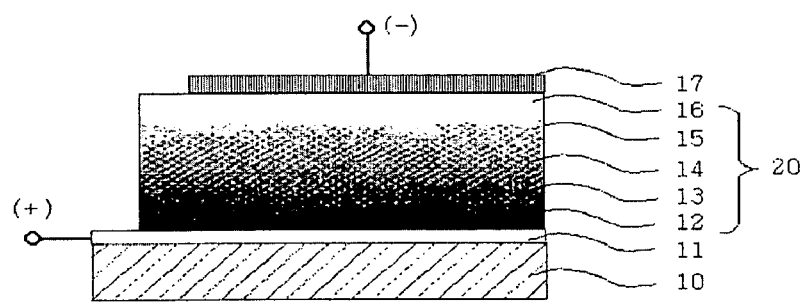
FIG. 2a is a structure diagram for illustrating an organic EL device having a continuous non-boundary multi-layer organic semiconductor thin film in accordance with the first embodiment of the present invention.
Figure 2B:
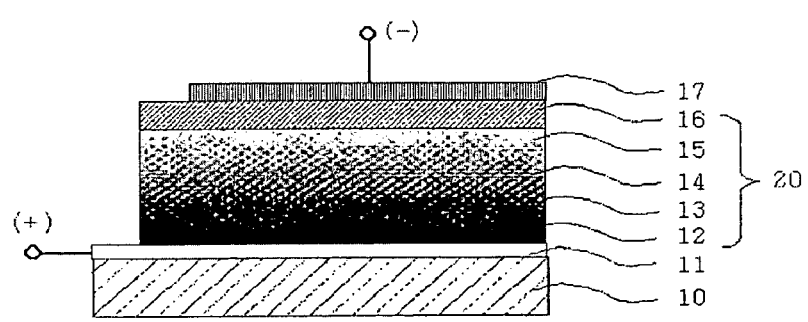
FIG. 2b is a structure diagram for illustrating an organic EL device having a continuous non-boundary multi-layer organic semiconductor thin film in accordance with the second embodiment of the present invention.

The organic semiconductor thin film suggested by the present invention can be forced to be formed by depositing compounds in the order of hole injecting layer, hole transporting layer, light-emitting layer, electron transporting layer and electron injecting layer on the anode. The thickness of the organic semiconductor thin film ranges from 0.001 to 1 μm, which is not intended to be limiting. FIG. 2a shows the representative example of the organic EL device of the present invention. As shown in FIG. 2a, the organic EL device includes an organic semiconductor thin film, namely an EL layer 20 formed by sequentially depositing at least two organic semiconductor materials (compounds) between electrodes 11, 17. The organic semiconductor materials form a hole injecting layer 12, a hole transporting layer 13, a light-emitting layer 14, an electron transporting layer 15 or an electron injecting layer 16, and the concentration of the material changes with a gradient along with its deposition direction at the interfaces. In addition, as shown in FIG. 2b, a hole injecting layer 12, a hole transporting layer 13, a light-emitting layer 14 and an electron transporting layer 15 can be produced to a continuous non-boundary multi-layer structure, and an electron injecting layer 16 can be formed by a conventional wet process or a dry process such as vacuum evaporation on the non-boundary multi-layer.

In the present invention, the vacuum evaporator to form an organic multi-layer is not necessary, thus the whole manufacturing system can be simplified and easily maintained. In addition, the present invention can be applied to an active matrix EL device as well as a passive matrix EL device.

The organic EL device of the present invention can be manufactured by coating a composite solution prepared by dissolving at least two organic compounds in a mixed solvent including at least two organic solvents having different volatility and having different solubilities of the organic compounds, on the substrate where the electrode has been formed, and by evaporating the organic solvents from the coated composite solution to sequentially deposit the organic compounds. The composite solutions used to produce the organic EL device may include at least one organic light-emitting semiconductor compound emitting red, green or blue light. Preferably, the composite solution is optimized to enable the devices to display wide ranges of colors (for example, 460, 520 and 650 nm of narrow lines for B, G and R). The light-emitting materials of the organic EL device of the present invention are not limitative, and thus a variety of the conventional compounds for manufacturing an organic EL device can be used in the present invention. Preferably, low molecular weight fluorescent materials or fluorescent polymer materials having the light-emitting property can be used, and the mixture of the low molecular weight materials and the polymer materials can also be used.

Exemplary low molecular weight organic compounds used as the green light-emitting materials include $Alq_3$, $BeBq_2$ (10-benzo[h]quinolinol-beryllium complex), and Almq (tris (4-methyl-8-quinolinolate)aluminum) which emit light in a green color range (550 nm). Typically, a few mol % of quinacridone, coumarin, C545T (Eastman Kodak Co.), or Ir-complex can be added (doped) to improve light-emitting efficiency and durability. Also, exemplary doping materials of a red light-emitting layer include Indigo, Nile Red, DCM (4-(dicyanomethylene)-2-methyl-6-(p-dimethyl aminostyryl)-4H-pyran), DCJTB (Eastman Kodak Co.), and Pt-complex.

Exemplary blue light-emitting materials include metal complexes such as ZnPBO ((Bis[2-(2-benzoxazolyl)phenolato] Zinc(II)) and Balq (Bis(2-methyl-8-quinolinolato) (paraphenyl-phenolato) aluminum), or non-metal complexes such as styrylarylene derivatives, namely DPVBi (4,4'-bis(2,2'-biphenylvinyl)-1,1'-biphenyl), oxadiazole derivatives, bisstyryl anthracene derivatives, and bisstyryl arylene derivatives such as BczVBi (4,4'-Bis((2-carbazole)vinylene) biphenyl). However, the light-emitting materials of the organic EL device of the present invention are not specifically limited, and thus the aforementioned materials are not intended to be limiting. Exemplary polymer organic compounds, used as the light-emitting materials of the organic EL device, include poly(p-phenylene), polyphenylene-vinylene, polyarylene, polyalkylthiophene and polyalkylfluorine. When the fluorescent polymer materials are used for the light-emitting layer of the organic EL device, the fluorescent polymer materials can be a block, random or graft copolymers, which also are not intended to limiting the present invention.

In the organic EL device of the present invention, exemplary hole injecting and hole transporting materials include soluble phthalocyanine compounds, aromatic diamine compounds such as TPD ((N,N'-diphenyl-N,N'-bis(3-methylphenyl)-[1,1'-biphenyl]-4,4'-diamine: triphenylamine derivative), MTDATA (4,4', 4'-tris[3-methylphenyl (phenyl)amino] triphenylamine), quinacridone, bisstyryl anthracene derivatives, PVK(polyvinyl carbazole), porphyrinic compounds, α-NPD (N,N'-diphenyl-N,N'-bis(1-naphthylphenyl)-1,1'-biphenyl-4,4'-diamine), polyaniline, and conductive polymers, which is not intended to be limiting. Exemplary electron injecting and electron transporting materials include $Alq_3$ which is an aluminum complex prepared by coordinating three hydroxyquinolines on aluminum atoms, and distyrylbiphenyl derivatives, which is not intended to be limiting.

In the organic EL device of the present invention, the light-emitting layer and other organic layers can be formed to a thin film with an appropriate binder resin. If necessary, an appropriate dopant can be included in the layer. Exemplary binder resins include polyvinylcarbazole(PVK) resins, polycarbonate resins, polyester resins, polyallylate resins, butyral resins, polyvinylacetal resins, diallyphthalate resins, acrylic resins, methacrylic resins, phenol resins, epoxy resins, silicone resins, polysulfone resins and urea resins. The resins can be used alone or as a copolymer including two or more resins, which is not intended to be limiting.

Exemplary solvents for forming the mixed solvent of the present invention include methyl alcohol, ethyl alcohol, n-propyl alcohol, isopropyl alcohol, n-butyl alcohol, sec-butyl alcohol, tert-butyl alcohol, dimethylformamide, dimethylacetamide, ketone, acetone, diacetone alcohol, keto-alcohol, dioxane, ether, polyethylene glycol, polypropylene glycol, polyalkylene glycol, ethylene glycol, propylene glycol, butylene glycol, triethylene glycol, hexylene glycol, diethylene glycol, glycerol, ethyleneglycol monomethyl ether, diethyleneglycol methylether, triethyleneglycol monomethylether, 2-pyrrolidon, toluene, xylene, chlorobenzene, dichlorobenzene, chloroform, dichloromethane, dichloroethane, gamma-butyl lactone, butyl cellosolve, cyclohexane, NMP(N-methyl-2-pyrrolidon), cyclohexanone, tetrahydrofurane(THF), carbon tetrachloride, tetrachloroethane, octylbenzene, dodecylbenzene, quinoline, trichlorobenzene, nitrobenzaldehyde, nitrobenzene, carbon disulfide, 2-heptanone, benzene, terpineol, butylcarbitolacetate and ion exchange water (pure water). The above-mentioned solvents are typical examples of the solvents which can be used in the present invention, and the present invention is not limited to the listed solvents. In the present invention, the selection of the at least two organic solvents having different volatilities may depend on the property of the organic compounds. Generally, organic solvents having boiling point difference more than 3° C., preferably 5° C., more preferably 10° C. can be used. If the difference in volatilities of the organic solvents is too small, the evaporation of the organic solvents must be slowly carried out. Otherwise, the organic compounds may not be deposited sequentially. In addition, the organic solvents are selected to sequentially deposit the organic compounds due to the organic compounds' solubility difference. If the solubilities of the organic compounds with respect to the selected solvents are the same, it is impossible to form the organic thin film having a concentration gradient according to the present invention.

The viscosity of the composite solution may affect the thickness of the EL layer, and the thickness of the EL layer is controlled to optimize the emitting intensity. The viscosity of the composite solution can be adjusted by the selection of solvents, preferably less than 5000 cp. The lower limit of the viscosity is not important in the present invention, but for example more than 100 cp, more preferably more than 1000 cp. The concentration of the EL materials in the solvents is determined so as to be suitable for the wet process, preferably from 0.005 to 10 wt %, more preferably 0.01 to 10 wt %. If the viscosity and concentration are away from the above ranges, the film formation by the wet process may not be efficiently performed.

When the EL layer 20 is formed by using the composite solution according to the wet process such as the spin coating, cast method, inkjet method, dipping method and printing method, the EL layer 20 may be deteriorated due to the moisture and oxygen of air. In order to remove moisture and oxygen, the EL layer 20 is preferably manufactured with a film formation device installed in a booth filled with low reactive gases, for example rare gases or inert gases such as argon, helium and nitrogen. Thereafter, the solvents to form the EL layer 20 are sequentially and completely removed by thermal evaporation. Preferably, the solvents are evaporated at a temperature lower than a glass transition temperature of the EL materials. In addition, the EL layer 20 can be formed with polymer precursors, and then the precursors can be transformed into polymer EL materials by heating or UV curing.

Then, the cathode 17 (or anode 11) is formed on the EL layer 20 formed on the anode 11 (or cathode 17) of the substrate 10. In general, the anode 11 is preferably made of a material having a high work function. Exemplary anode 11 materials include silver, nickel, gold, platinum, palladium, selenium, rhenium, iridium, alloys thereof, tin oxide, indium-tin-oxide, and copper iodide. In addition, conductive polymers such as polyaniline, poly(3-methylthiophene), polyphenylene sulfide and polypyrrole can be the materials for forming the anode. On the contrary, the cathode 17 is preferably made of a material having a low work function. Exemplary cathode materials include Al, Mg, Li, Cs, Ba, K, Be or Ca. Also, an electrode including MgAg (Mg: Ag=10:1) is preferably used, and MgAgAl electrode, LiAl electrode and LiF/Al electrode can be used. Optionally, a protective electrode to protect the cathode from external moisture can be formed, and the materials including Al or Ag can be used as the protective electrode.

Examples of the substrate 10 on which the EL layer 20 and the electrodes 11, 17 are formed include a transparent substrates made of glass, quartz or polymer and inorganic semiconductor substrates made of silicon or gallium arsenide, which is not intended to be limiting the present invention. Finally, in order to protect the EL device from external oxygen and moisture, the EL device is encapsulated with a sealing member such as glass, ceramic, plastic and metal under the inert gas atmosphere, or encapsulated with a thermosetting resin or ultraviolet ray curable resin. In addition, it is preferable to insert a hygroscopic material in the encapsulated space, and the representative example of the hygroscopic material is barium oxide.

In this specification, the device having one pixel is mainly disclosed to illustrate the present invention. However, a plurality of pixels having the same structure can be aligned in a matrix type to form the device of the present invention, and the color EL display device can also be manufactured according to the present invention. In addition, the present invention also can be applied to the color display devices in which a white EL device and a color filter are combined, a blue or bluish green EL device and a fluorescent color covering material layer are combined, or a transparent electrode is used as a cathode and an EL device corresponding to RGB is respectively laminated. It is also possible to manufacture a black and white display device by forming a white light-emitting layer on an EL layer. Example of the active matrix organic EL display according to the present invention includes a thin film transistor switching device. However, the present invention is not limited thereto, and other switching devices, such as two terminal devices, for example, MIM can also be used. Moreover, passive driving, static driving and segment display driving can also be used in the present invention. In addition, a single or plurality of switching devices can be formed on one pixel.

The organic EL device of the present invention will be better understood by referring to the following examples:

EXAMPLE 1

In this example, low molecular weight compound and polymer material were used as the organic semiconductor EL materials. PVK (poly-N-vinylcarbazole, molecular weight: 150,000, $T_{mp}$=277° C., $T_g$=156° C.) was used as the charge carrier binder resin, α-NPD (4,4 bis[N-(1-napthyl-N-phenyl-amino)biphenyl]) was used as the hole transporting material, and green light emitting $Alq_3$ (tris(8-quinolinolato)aluminum) was used as the light-emitting material and the electron transporting material. 1:1 (weight ratio) mixture of chloroform and dichloroethane ($ClCH_2CH_2Cl$) was used as the mixed solvent. Here, the boiling points of chloroform and dichloroethane were 62° C. and 82° C., respectively. Firstly, in order to evaluate the depositing speed and depositing order of each organic material in the mixed solvent, the EL materials were dissolved in the mixed solvent in the amount of 0.05 wt %. The depositing order of the EL materials according to the evaporation of the mixed solvent was evaluated. As the evaporation proceeded, chloroform was firstly evaporated, and α-NPD and PVK having lower solubilities in the dichloroethane were deposited to form a thin film. At the same time, a small amount of $Alq_3$ was also co-deposited. When chloroform was almost completely evaporated, deposition of α-NPD was ceased. Then, dichloroethane was evaporated, and $Alq_3$ dissolved in the solution (dichloroethane) was deposited with PVK to form another thin film on the lower α-NPD and PVK layer. On the boundary between the α-NPD and $Alq_3$ thin films, α-NPD and $Alq_3$ are coexisted, and PVK was evenly dispersed on the whole thickness range of the thin films. Therefore, the mixed solution was useful for depositing the continuous non-boundary α-NPD~Alq$_3$ multi-layer ((1) anode/hole injecting and transporting layers~light-emitting layer/cathode), and PVK worked as the charge carrier binder resin.

The EL device according to an embodiment of the present invention was formed as follows. An organic EL layer was made of an organic semiconductor thin film formed by continuous depositions thereof.

(a) A glass substrate coated with Indium-Tin-Oxide (ITO) was ultrasonically washed in a commercially available cleaning agent, and then washed with deionized water.

(b) The composite solution (chloroform:dichloroethane=1:1), in which PVK, α-NPD and Alq$_3$ organic materials were dissolved, was filtered through 0.2 μm Teflon filter. Thereafter, the composite solution was spin-coated on the ITO for 3 minutes under a spinning speed of 3000 rpm.

(c) The EL layer was thermally treated at 80° C. for 30 minutes to completely evaporate the solvents in the EL layer. The thickness of the produced thin film was 500 to 700 Å.

(d) 2000 Å of Al:Li cathode was deposited on the EL layer with vacuum evaporation. The degree of vacuum was $5\times10^{-6}$ torr, and the deposition speed was 10 Å/second. Thereby, a circular shape organic EL device having a diameter of 4 mm was obtained. In order to protect the EL device from the external environment, the EL device was encapsulated in a dry globe box.

Figure 3A:
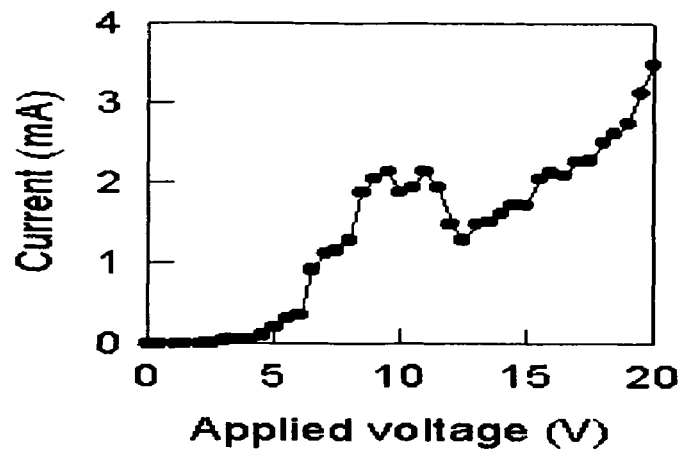
FIGS. 3a and 3b are graphs showing V-I and V-L characteristics of the EL device in accordance with the first embodiment of the present invention.
Figure 3B:
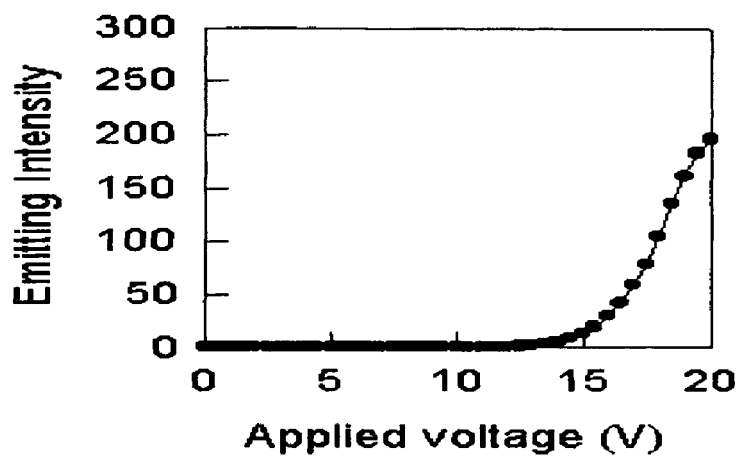

The produced (ITO/α-NPD(PVK)~Alq$_3$(PVK)/Al:Li) EL device had the light-emitting initiation voltage (Vonset) of ~13V, and the current flowing through the EL device and the EL intensity at the voltage of 20V were 3.5 mA and ~196 cd/m$^2$, respectively. The EL device emitted the uniform green light (540 nm). In addition, when the device was driven at a constant voltage of 20V, the organic EL display panel performed the stable light emission for a long time. The characteristics of the EL device are summarized in Table 1,and the voltage-current (V-I) and voltage-EL intensity (V-L) properties of the EL device are shown in FIGS. 3a and 3b,respectively.

EXAMPLE 2

The same organic materials as the EL materials of Example 1 were used in this Example. 1:1 (weight ratio) mixture of dichloroethane and dichloromethane (CH$_2$Cl$_2$) was used as the mixed solvent. Here, the boiling points of dichloroethane and dichloromethane were 82° C. and 40° C., respectively. The deposition speed and deposition order of each organic material from the mixed solvent were evaluated.

As the evaporation proceeded, dichloromethane was firstly evaporated, and α-NPD and PVK having lower solubilities in dichloroethane were deposited to form a thin film. At the same time, a small amount of Alq$_3$ was also deposited. When dichloromethane was almost completely evaporated, deposition of α-NPD was ceased. Then, dichloroethane was evaporated, and Alq$_3$ dissolved in the solution (dichloroethane) was deposited with PVK to form another thin film on the lower α-NPD and PVK layer. On the boundary between the α-NPD and Alq$_3$ thin films, α-NPD and Alq$_3$ are coexisted, and PVK was evenly dispersed on the whole thickness range of the thin films. Therefore, the mixed solution was useful for depositing the continuous non-boundary α-NPD~Alq$_3$ multi-layer, and PVK worked as the charge carrier binder resin.

Figure 4A:
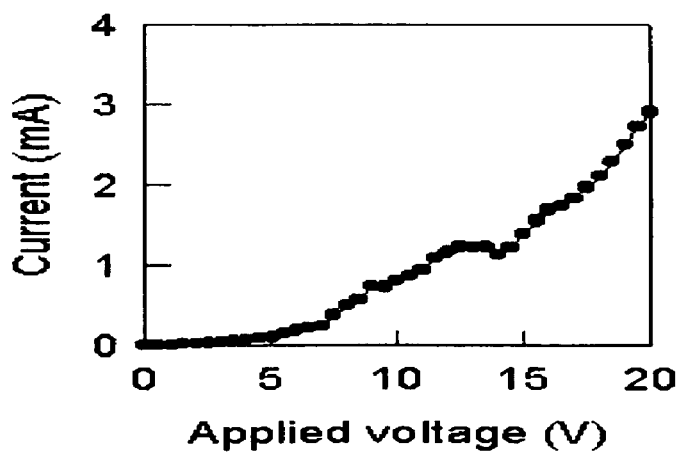
FIGS. 4a and 4b are graphs showing V-I and V-L characteristics of the EL device in accordance with the second embodiment of the present invention.
Figure 4B:
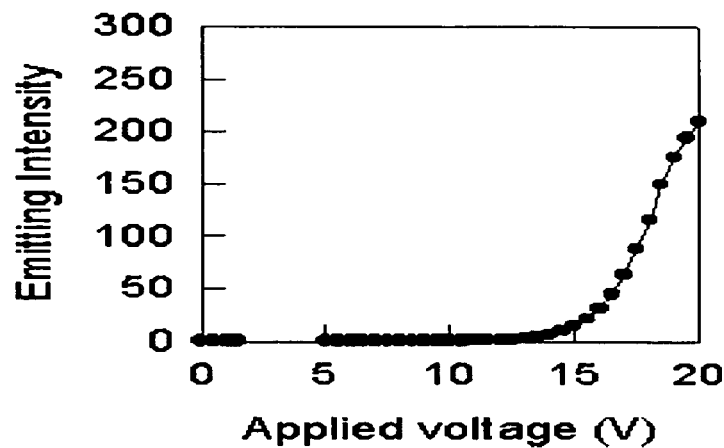

The EL device according to an embodiment of the present invention was formed according to the method described in Example 1 except for using the mixed solvent (dichloroethane:dichloromethane=1:1). The produced EL device had the light-emitting initiation voltage (V$_{onset}$) of ~13V, and the current flowing through the EL device and the EL intensity at the voltage of 20V were 2.9 mA and ~210 cd/m$^2$, respectively. The EL device emitted the uniform green light (540 nm). In addition, when the device was driven at a constant voltage of 20V, the organic EL display panel performed the stable light emission for a long time. The characteristics of the EL device are summarized in Table 1,and the voltage-current (V-I) and voltage-EL intensity (V-L) properties of the EL device are shown in FIGS. 4a and 4b, respectively.

COMPARATIVE EXAMPLE 1

The same organic materials as the EL materials of Example 1 were used in this Comparative Example. 1:1 (weight ratio) mixture of chloroform and toluene was used as the mixed solvent. Here, the boiling points of chloroform and toluene were 62° C. and 110° C., respectively. The deposition speed and deposition order of each organic material from the mixed solvent were evaluated. As the evaporation proceeded, chloroform was firstly evaporated, and Alq$_3$, α-NPD and PVK having lower solubilities to toluene were deposited to form a non-uniform thin film. When chloroform was completely evaporated, the depositions of Alq$_3$ and α-NPD were ceased. Then, toluene was evaporated, and PVK dissolved in the solution was deposited to form a uniform thin film. Thus, the mixed solvent was not useful for forming the continuous non-boundary multi-layer.

Figure 5A:
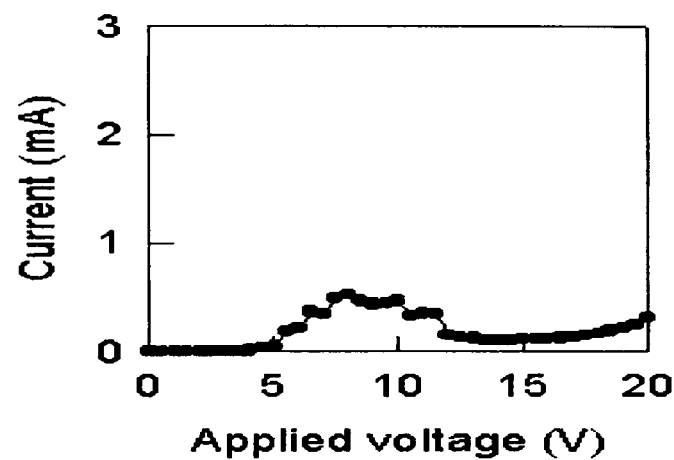
FIGS. 5a and 5b are graphs showing V-I and V-L characteristics of an EL device in accordance with the comparative example 1.
Figure 5B:
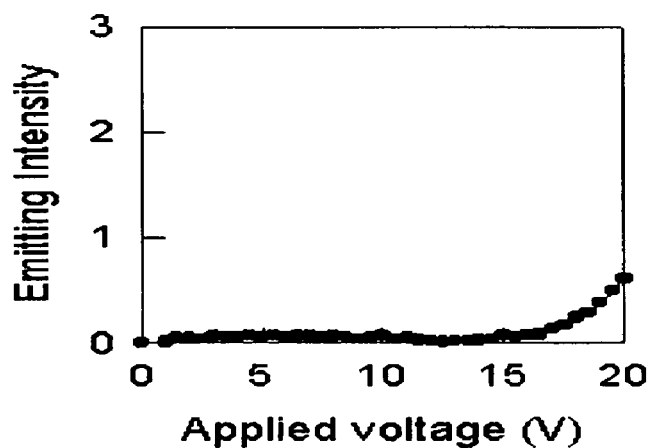

The EL device was formed according to the method described in Example 1 except for using the mixed solvent (chloroform:toluene=1:1). The produced EL device had the light-emitting initiation voltage (V$_{onset}$) of ~18V, and the current flowing through the EL device and the EL intensity at the voltage of 20V were less than 0.3 mA and ~1 cd/m$^2$ respectively. The EL device emitted the non-uniform and unstable green light. The characteristics of the EL device are summarized in Table 1,and the voltage-current (V-I) and voltage-EL intensity (V-L) properties of the EL device are shown in FIGS. 5a and 5b, respectively.

COMPARATIVE EXAMPLE 2

The same organic materials as the EL materials of Example 1 were used in this Comparative Example. The single solvent of chloroform was used as the solvent. The deposition order of each organic material from the solvent was evaluated. As the chloroform evaporated, Alq$_3$, α-NPD and PVK were deposited to form a uniform thin film. Thus, the single solvent was useful for forming the single-layer where α-NPD and Alq$_3$ were uniformly dispersed, but was not useful for forming the continuous non-boundary multi-layer.

Figure 6A:
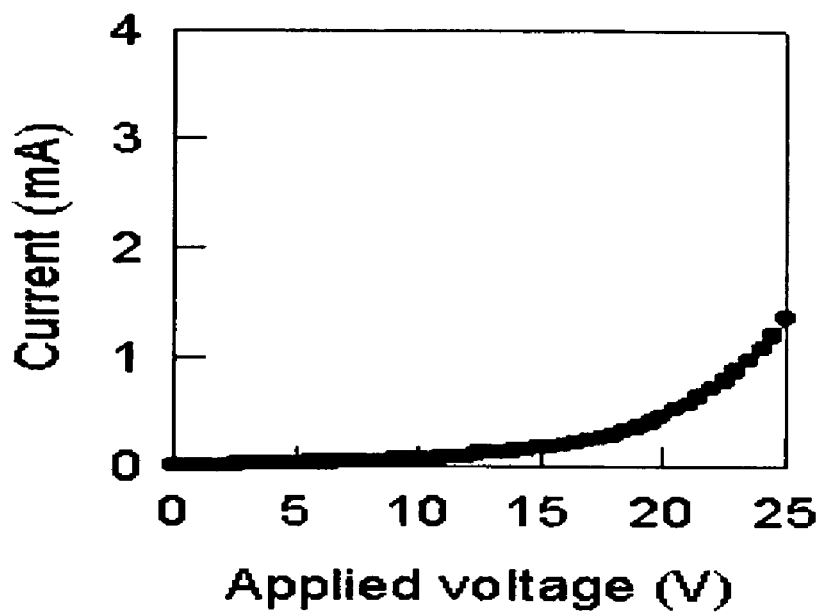
FIGS. 6a and 6b are graphs showing V-I and V-L characteristics of an EL device in accordance with the comparative example 2.
Figure 6B:
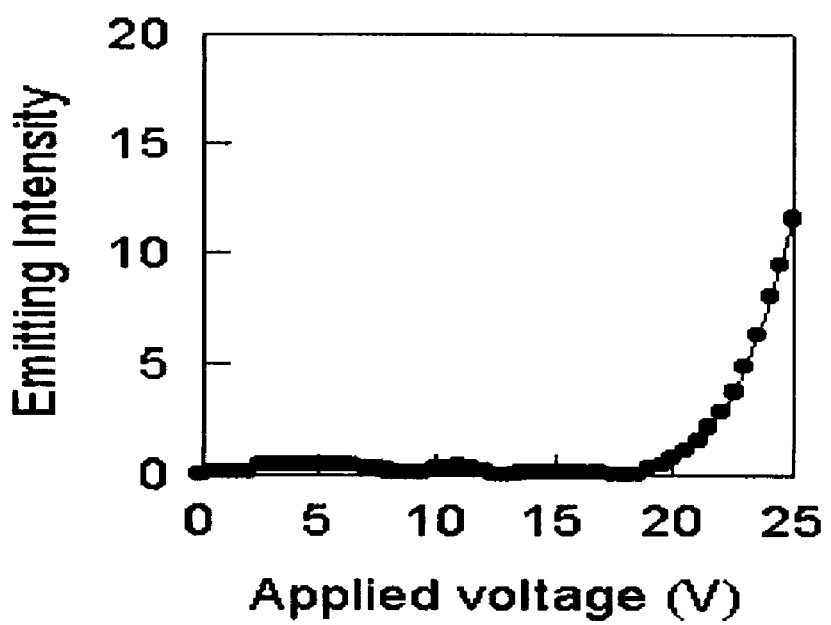

The EL device was formed according to the method described in Example 1 except for using the single solvent (chloroform). The produced organic thin film was a single layer in which the organic materials are uniformly dispersed. The produced EL device had the light-emitting initiation voltage (V$_{onset}$) of ~19V, and the current flowing through the EL device and the EL intensity at the voltage of 20V were less than 0.5 mA and ~1 cd/m$^2$ respectively. The EL device emitted the non-uniform and unstable green light. The characteristics of the EL device are summarized in Table 1,and the voltage-current (V-I) and voltage-EL intensity (V-L) properties of the EL device are shown in FIGS. 6a and 6b, respectively.

Therefore, the EL device having the organic semiconductor thin film with continuous non-boundary multi-layer structure of Examples 1 and 2 have much better operation efficiency than the EL device having single layer thin film of Comparative Examples 1 and 2. The properties of the produced EL devices are summarized in Table 1.

TABLE 1

|  | Shape of thin film | $V_{onset}$ (V) | EL intensity at 20 V | Current at 20 V (mA) |
| --- | --- | --- | --- | --- |
| Example 1 | Non-boundary multi-layer | 13.0 | 195.6 | 3.5 |
| Example 2 | Non-boundary multi-layer | 13.0 | 209.5 | 2.9 |
| Comparative Example 1 | Uniformly distributed multi layer | 18.0 | 0.6 | 0.3 |
| Comparative Example 2 | Uniformly distributed layer | 19.0 | 0.8 | 0.5 |

As described, the organic semiconductor thin film having the non-boundary multi-layer structure of the present invention is different from the conventional uniformly distributed single-layer film or multi-layer film, and can be easily manufactured. The organic EL device has the lower driving voltage and higher operation efficiency than the devices produced with the single or simply mixed solvents. Thus, it is possible to reduce the manufacturing cost of the efficient light-emitting device and produce an electronic device having high quality of display images. The organic EL device of the present invention can be applied to various display devices, televisions, digital cameras, computers, notebook computers, mobile computers, portable image recording or displaying device, screens, bulletin boards, store signs, goggle type displays, car displays, video cameras, printer displays, remote control devices, phone displays, mobile phones, etc.

As shown in the above Examples, the organic semiconductor thin film of the present invention having the non-boundary multi-layer structure has the excellent "applied voltage": "light emitting intensity" property, and "applied voltage": "current" properties, which are similar to non-linear current properties of a typical diode device. As a result, the organic semiconductor thin film of the present invention can also be applied to various organic semiconductor devices such as organic diode devices.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing an organic semiconductor device, comprising the steps of:
    coating a composite solution on a substrate, wherein the composite solution is prepared by dissolving a first organic compound and a second organic compound in a mixed organic solvent, the mixed organic solvent having a first solvent with relatively low boiling point and a second solvent with relatively high boiling point, and a solubility of the first organic compound in the second solvent is relatively low while a solubility of the second organic compound in the second solvent is relatively high; and
    thermally treating the substrate so that the first solvent and second solvent of the mixed organic solvent are sequentially evaporated from the coated composite solution and then the first organic compound and the second organic compound are sequentially deposited as a continuous non-boundary multi-layer structure.

2. The method of claim 1, wherein the first organic compound and the second organic compound are selected from the group consisting of compounds for forming hole injecting layer, hole transporting layer, light-emitting layer, electron transporting layer and electron injecting layer, and the organic semiconductor device is an organic light emitting device.

3. The method of claim 2, wherein the first organic compound or the second organic compound further include a dopant and/or a binder resin.

4. The method of claim 1, wherein the step for coating the composite solution on the substrate is performed by a method selected from the group consisting of a printing method, an inkjet method, spin coating, and a dipping method.

5. The method of claim 1, further comprising the steps of:
    forming an electrode after depositing the first organic compound and the second organic compound; and
    encapsulating the electrode and the deposited first organic compound and the second organic compound under an inert gas atmosphere.

6. The method of claim 1, wherein the first solvent and the second solvent are selected from the group consisting of methyl alcohol, ethyl alcohol, n-propyl alcohol, isopropyl alcohol, n-butyl alcohol, sec-butyl alcohol, tert-butyl alcohol, dimethylformamide, dimethylacetamide, ketone, acetone, diacetone alcohol, keto-alcohol, dioxane, ether, polyethylene glycol, polypropylene glycol, polyalkylene glycol, ethylene glycol, propylene glycol, butylene glycol, triethylene glycol, hexylene glycol, diethylene glycol, glycerol, ethyleneglycol monomethyl ether, diethyleneglycol methylether, triethyleneglycol monomethylether, 2-pyrrolidon, toluene, xylene, chlorobenzene, dichlorobenzene, chloroform, dichloromethane, dichloroethane, gamma-butyl lactone, butyl cellosolve, cyclohexane, NMP (N-methyl-2-pyrrolidon), cyclohexanone, tetrahydrofurane (THF), carbon tetrachloride, tetrachloroethane, octyl benzene, dodecyl benzene, quinoline, trichlorobenzene, nitrobenzaldehyde, nitrobenzene, carbon disulfide, 2-heptanone, benzene, terpineol, butylcarbitolacetate and ion exchange water.

7. The method of claim 1, wherein a concentration of the first organic compound and the second organic compound in the composite solution ranges from 0.005 to 10 wt %.

8. The method of claim 1, wherein a viscosity of the composite solution is less than 5000 cp.

9. The method of claim 1, wherein the organic semiconductor device is an organic light emitting device, and the step for continuously depositing the organic compounds is separately carried out for red, green and blue pixels.

10. A method for manufacturing an organic semiconductor device, comprising the steps of:
    coating on a substrate a composite solution comprising a first organic compound, a second organic compound. a first solvent and a second solvent, wherein the boiling point of the first solvent is lower than the boiling point of the second solvent and the first organic compound has a solubility in the second solvent which is lower than the solubility of the second organic compound in the second solvent; and
    thermally treating the substrate so that the first organic solvent and second organic solvent of the mixed organic solvent are sequentially evaporated such that the first organic compound and the second organic compound are sequentially deposited as a continuous non-boundary multilayer structure.

11. The method of claim 1, wherein the difference of the first solvent and the second solvent in view of boiling point is more than 30° C.

12. The method of claim 6, wherein the first solvent and second solvent are chloroform and dichloroethane, respectively and the first organic compound and the second organic compound are α-NPD and Alq3, respectively.

13. The method of claim 6, wherein the first solvent and second solvent are dichloromethane and dichloroethane, respectively and the first organic compound and the second organic compound are α-NPD and Alq3, respectively.

14. The method of claim 1, wherein a temperature for evaporating the mixed solvent is lower than a glass transition temperature of the first and the second organic compounds.

* * * * *